United States Patent [19]
Sato et al.

[11] Patent Number: 6,134,064
[45] Date of Patent: Oct. 17, 2000

[54] PLAYBACK CLOCK EXTRACTING APPARATUS

[75] Inventors: Masafumi Sato, Ibaraki; Kiyokazu Hashimoto, Matsubara; Masato Izawa, Neyagawa, all of Japan

[73] Assignee: Matsushita Electric Industrial Co., Ltd., Osaka, Japan

[21] Appl. No.: 09/080,385

[22] Filed: May 18, 1998

[30] Foreign Application Priority Data

May 20, 1997 [JP] Japan ..................................... 9-129508

[51] Int. Cl.$^7$ ....................................................... G11B 5/09
[52] U.S. Cl. ................................................. 360/51; 360/65
[58] Field of Search ..................................... 375/229, 232, 375/233; 369/48, 59; 360/51, 27, 53, 8, 65, 46, 32

[56] References Cited

U.S. PATENT DOCUMENTS 6,002,538 12/1999 Kanegae et al. ........................... 360/46

OTHER PUBLICATIONS

Recent Developments of Signal Processing in Digital Magnetic Storage, Mr. Seiich Mita in the Journal o the Institute of Electronics, Information and Communication Engineers of Japan, C–II, vol. J75–C–11, No. 11, pp. 6511–623, Nov., 1992.

*Primary Examiner*—Alan T. Faber
*Attorney, Agent, or Firm*—Wenderoth, Lind & Ponack, L.L.P.

[57] ABSTRACT

A playback clock extracting device having: a quantization member for quantizing, at a sampling clock rate having a rate twice a recording rate, a signal played back from a recording medium so as to output sample data, a digital equalizer for subjecting the sample data to digital equalization so as to alternately output playback data and PLL data at an interval of one sampling clock, cycle a ternary decision member for making a ternary decision as to whether the playback data is positive, zero or negative. The playback clock extracting device further having arithmetic unit for calculating a sampling phase error in the quantization member by multiplying a result of the decision of the ternary decision member by a difference between two successive data values of the PLL data outputted immediately prior to and immediately after the playback data for the decision of the ternary decision member, respectively, a sampling clock generating member which controls a phase and an oscillation frequency on the basis of the sampling phase error outputted by the arithmetic unit so as to generate the sampling clock, and a playback clock generating member which divides a frequency of the sampling clock by two so as to generate a playback clock for detecting the playback data.

7 Claims, 14 Drawing Sheets

Fig. 7A Sampling clock / Replay clock

Fig. 7B (Phase lead)

Fig. 7C (Phase lag)

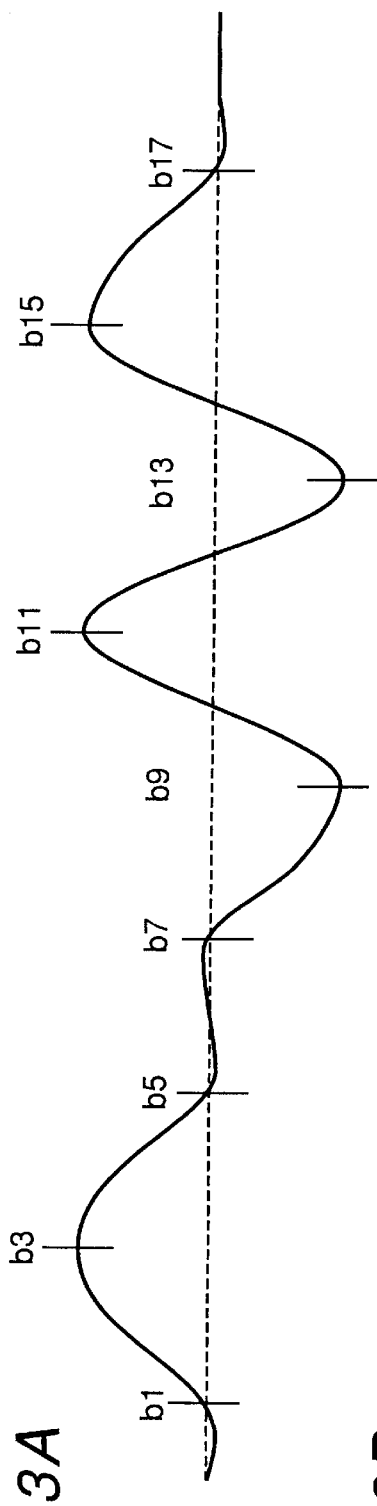
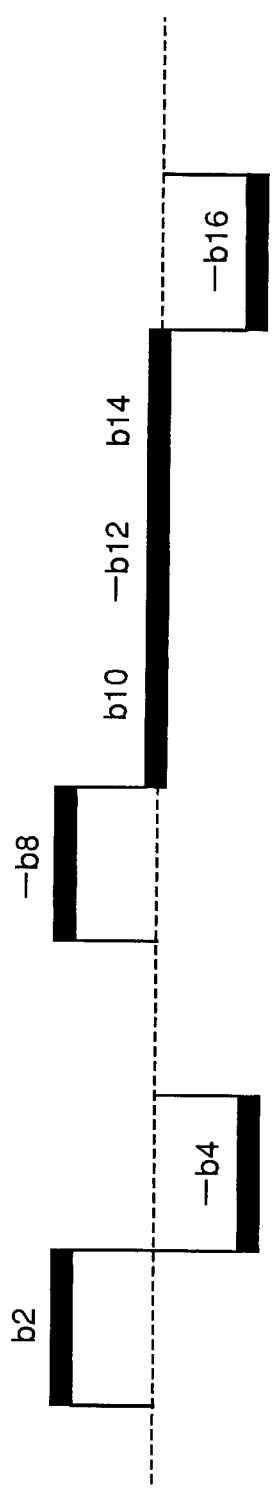
Fig. 13A
Fig. 13B
Fig. 13C

PLAYBACK CLOCK EXTRACTING APPARATUS

BACKGROUND OF THE INVENTION

The present invention relates to a playback clock extracting apparatus suitable for extracting from a differential wave-form signal played back from a recording medium, a playback clock synchronous in phase with the signal.

In case digital data recorded on a magnetic tape or the like is played back from the magnetic tape, a playback clock is extracted from a playback differential wave-form signal and the digital data is detected synchronously with the extracted playback clock. The played back signals contain in their transitional portions synchronous information, i.e., information on phase of the playback clock.

FIG. 1 shows a configuration of a conventional playback clock extracting apparatus. In FIG. 1, an analog equalizer 10 receives a playback differential wave-form signal and outputs it through wave-form equalization. An analog-to-digital converter 11 samples, at a playback clock (sampling clock) of recording rate, a signal outputted by the analog equalizer 10 and outputs the signal as digital data. A flip-flop 101 for making timing adjustment receives and latches this signal and outputs the signal as playback data. A ternary decision circuit 12 makes a ternary decision of the inputted playback data and outputs a result of the decision. Namely, if the inputted playback data is larger than a positive threshold level in FIGS. 2A–C a decision of "1" is made. Meanwhile, if the inputted playback data is smaller than a negative threshold level in FIG. 2, a decision of "−1" is made. In cases other than the above two cases, a decision of "0" is made.

A voltage controlled oscillator 14 adjusts frequency on the basis of an inputted phase error output and outputs a generated playback clock. Namely, if the inputted phase error output is a positive value and a negative value, the frequency of the generated playback clock becomes momentarily large and small, respectively. This playback clock is delivered to the analog-to-digital converter 11 and flip-flops 101, 131 and 132.

An arithmetic circuit 13 for calculating a phase error is constituted by the two flip-flops 131 and 132 for making timing adjustment, a subtracter 133 and a multiplier 134. The current playback data is subjected to a delay of two clock cycles of the playback clock by the flip-flops 131 and 132. Then, playback data preceding the current playback data by two clock cycles of the playback clock is subtracted from the current playback data in the subtracter 133. Subsequently, this result of subtraction is multiplied by the result of the decision outputted from the ternary decision circuit 12 in the multiplier 134 and this result of multiplication is outputted as the phase error output representing error of sampling phase.

Meanwhile, since a delay of one clock cycle of the playback clock is made from output of the analog-to-digital converter 11 to an output of the ternary decision circuit 12 by the flip-flop 101 and a delay of two clock cycles of the playback clock is made from the output of the analog-to-digital converter 11 to an output of the flip-flop 132 by the two flip-flops 131 and 132, a result of a decision on data which precedes, by one clock cycle of the playback clock, data inputted to a (−) terminal of the subtracter 133 and follows, by one clock cycle of the playback clock, data inputted to a (+) terminal of the subtracter 133 is delivered from the ternary decision circuit 12 to the multiplier 134. A loop including the analog-to-digital converter 11, the arithmetic circuit 13 and the voltage controlled oscillator 14 constitute a phase locked loop (PLL) circuit.

FIGS. 2A–C are timing charts showing relationship between the playback differential wave-form signal and the playback clock (sampling clock) in the conventional playback clock extracting apparatus of FIG. 1. In FIGS. 2A–C, digital data obtained through sampling at sampling points a to h of the playback clock (sampling clock) in the analog-to-digital converter 11 has values A to H, respectively. In the conventional playback clock extracting apparatus of FIG. 1, since the playback differential wave-form signal is subjected to sampling at each rise of the playback clock by the analog-to-digital converter 11 and then, is latched by the flip-flop 101, the playback data assumes the values A to H.

FIG. 2A illustrates a case in which the playback clock is in phase with the playback differential wave-form signal. In this case, a result of a decision made by the ternary decision circuit 12 is other than "0" when the result of the decision is "1" for the value C and is "−1" for the value F. At this time, the phase error output from the arithmetic unit 13 assumes a value of (B−D) {=(B−D)×(1)} and a value of (G−E) {=(E−G)×(−1)}, respectively. In phase of FIG. 2A, since both of the values of (B−D) and (G−E) are substantially zero, the frequency of the playback clock generated by the voltage controlled oscillator 14 is held and the playback clock generated by the voltage controlled oscillator 14 is held in phase with the playback differential wave-form signal.

FIG. 2B illustrates a case in which the playback clock leads in phase the playback differential wave-form signal. Also in this case, a result of a decision made by the ternary decision circuit 12 is other than "0" when the result of the decision is "1" for the value C and is "−1" for the value F. At this time, the phase error output from the arithmetic unit 13 assumes a value of (B−D) {=(B−D)×(1)} and a value of (G−E) {=(E−G)×(−1)}, respectively. In phase of FIG. 2B, since both of the values of (B−D) and (G−E) are negative, the frequency of the playback clock generated by the voltage controlled oscillator 14 becomes small momentarily and the playback clock generated by the voltage controlled oscillator 14 shifts in such a direction as to lag in phase relative to the playback differential wave-form signal, i.e., in such a direction as to be in phase with the playback differential wave-form signal.

FIG. 2C illustrates a case in which the playback clock lags in phase behind the playback differential wave-form signal. Also in this case, a result of a decision made by the ternary decision circuit 12 is other than "0" when the result of the decision is "1" for the value C and is "−1" for the value F. At this time, the phase error output from the arithmetic unit 13 assumes a value of (B−D) {=(B−D)×(1)} and a value of (G−E) {=(E−G)×(−1)}, respectively. In phase of FIG. 2C, since both of the values of (B−D) and (G−E) are positive, the frequency of the playback clock generated by the voltage controlled oscillator 14 becomes large momentarily and the playback clock generated by the voltage controlled oscillator 14 shifts in such a direction as to lead in phase the playback differential wave-form signal, i.e., in such a direction as to be in phase with the playback differential wave-form signal.

Therefore, in the conventional playback clock extracting apparatus of FIG. 1, automatic control is performed so as to bring the playback clock into phase with the playback differential wave-form signal such that signals are played back as accurately as possible.

However, the following problems (1) to (4) arise in the conventional playback clock extracting apparatus of FIG. 1.

(1) At continuously changing portions of the playback differential wave-form signal, it is impossible to fetch phase information.

(2) According to characteristics of a magnetic tape or the like, a phenomenon (hereinafter, referred to as "phase jitter") may happen that the phase of the generated playback clock is shifted additionally from the phase of the playback differential wave-form signal in a state where the playback differential wave-form signal is not subjected to wave-form equalization or is subjected to incomplete wave-form equalization. As a result, signals cannot be played back accurately. When wave-form equalization is performed digitally after analog-to-digital conversion in order to solve this problem, wave-form equalization enters the loop of the PLL circuit, so that convergence of the wave-form equalization and the PLL should be performed simultaneously and thus, the convergence is delayed or is performed erroneously due to lack of information content. Hence, it is essential that analog waveform equalization be performed prior to analog-to-digital conversion.

(3) In order to give a decision margin to the ternary decision circuit 12, the positive and negative threshold levels are required to be set small and large, respectively. As a result, a state (hereinafter, referred to as a "phase convergent point") in which the playback clock is finally converged into phase with the playback differential wave-form signal erroneously exists, in addition to a proper phase convergent point, also in case the phase of the playback clock is shifted through a half of a period and thus, signals may not be played back accurately.

(4) At portions of the playback differential wave-form signal, in which the playback differential wave-form signal is changing continuously, a large offset is generated in the momentary phase error output. Here, the term "offset" means a residual signal component in the momentary phase error output. The offset is finally cancelled by the integral effect of the PLL circuit, but affects the momentary phase of the generated playback clock, thus resulting in production of momentary phase jitter in the playback clock.

The above mentioned problem (1) is described below in more detail. Suppose that results of ternary decision on signal string {an} are as follows, the following phase error outputs are obtained.

| (Signal string) | (Ternary decision) | (Phase error output) |
| --- | --- | --- |
| a1 | 0 | |
| a2 | 0 | 0 |
| a3 | 1 | 0 |
| a4 | 0 | a2–a4 |
| a5 | 0 | 0 |
| a6 | –1 | 0 |
| a7 | 1 | a7–a5 |
| a8 | –1 | a6–a8 |
| a9 | 1 | a9–a7 |
| a10 | 0 | a8–a10 |

When values other than "0" continue in the results of ternary decision, the signals a7 and a8 are cancelled completely and the signals a6 and a9 do not contain phase information.

Then, regarding the problem (2) referred to above, a reason why phase jitter is produced in the generated playback clock is described below in more detail. Ideally, the playback differential wave-form signal from a magnetic tape or the like has satisfactory differential characteristics. Thus, when the playback clock is in phase with the playback differential wave-form signal in the analog-to-digital converter 11 of FIG. 1, the sampling values B and D at the points b and d are substantially zero as shown in FIG. 2A. However, actually, frequency characteristics of the playback differential wave-form signal deteriorate due to characteristics of the recording medium itself and a magnetic playback system. Therefore, in order to obtain ideal differential characteristics, wave-form equalization should be performed. In case the playback differential wave-form signal is not subjected to wave-form equalization or is subjected to incomplete wave-form equalization, the playback differential wave-form signal has differential characteristics which are greatly distorted greatly in the vicinity of zero-crossings.

FIG. 3 is a timing chart showing the relationship between the playback differential wave-form signal subjected to incomplete wave-form equalization and the playback clock in the conventional playback clock extracting apparatus of FIG. 1. In FIG. 3, digital data obtained through sampling at sampling points a to h of the playback clock (sampling clock) in the analog-to-digital converter 11 has values A to H, respectively. In FIG. 3, although the playback clock is in phase with the playback differential wave-form signal, the playback differential wave-form signal subjected to incomplete wave-form equalization is distorted in the vicinity of zero-crossings, i.e., points d and g. Hence, both of values of (B–D) and (G–E) of the phase error output from the arithmetic unit 13 are positive, so that the frequency of the playback clock generated by the voltage controlled oscillator 14 becomes large momentarily and thus, the playback clock leads in phase the playback differential wave-form signal.

Namely, if phase error is calculated in a state where the playback differential wave-form signal is not subjected to wave-form equalization or is subjected to incomplete waveform equalization, phase jitter is produced in the generated playback clock.

Subsequently, concerning the above mentioned problem (3), a reason why the wrong phase convergent point exists is described below in more detail. FIGS. 4A and B are timing charts showing the relationship between the playback differential wave-form signal and the playback clock (sampling clock) in the conventional playback clock extracting apparatus of FIG. 1. In FIGS. 4A and B, digital data obtained through sampling at sampling points a to h of the playback clock (sampling clock) has values A to H, respectively.

FIG. 4A illustrates a case in which the playback clock leads in phase by about 170° the playback differential wave-form signal. In this case, a result of a decision made by the ternary decision circuit 12 is other than "0" when the result of the decision is "1" for the values C and D and is "–1" for the values F and G. At this time, the phase error output from the arithmetic unit 13 assume values of (B–D), (C–E), (G–E) and (H–F).

In FIG. 4A, the negative value of (B–D) and the positive value of (C–E) are sequentially given, as the phase error output, from the arithmetic circuit 13 to the voltage controlled oscillator 14. Furthermore, the negative value of (G–E) and the positive value of (H–F) are sequentially delivered from the arithmetic unit 13 to the voltage controlled oscillator 14. The values of (B–D) and (C–E) cancel substantially cancel each other, but do not eliminate each other completely so as to total slightly positive, i.e., {(C–E)+(B–D)}>0. Similarly, the values of (G–E) and (H–F) substantially cancel each other, but do not eliminate each other completely so as to total slightly positively, i.e., {(H–F)+(G–E)}>0. Accordingly, the frequency of the playback clock generated by the voltage controlled oscillator 14 becomes large momentarily and the playback clock is shifted so as to lead in phase the playback differential wave-form signal. When the phase has finally led through not 0° but just a half of a period, i.e., 180°, phase is converged. At this time, wrong playback signals are outputted.

FIG. 4B illustrates a case in which the playback clock leads in phase by about 190° the playback differential wave-form signal, namely, lags in phase by about 170° behind the playback differential wave-form signal. Also in this case, a result of a decision made by the ternary decision circuit 12 is other than "0" when the result of the decision is "1" for the values C and D and is "−1" for the values F and G. At this time, the phase error output from the arithmetic unit 13 assumes values of (B−D), (C−E), (G−E) and (H−F).

In FIG. 4B, the negative value of (B−D) and the positive value of (C−E) are sequentially given, as the phase error output, from the arithmetic circuit 13 to the voltage controlled oscillator 14. Furthermore, the negative value of (G−E) and the positive value of (H−F) are sequentially delivered from the arithmetic unit 13 to the voltage controlled oscillator 14. The values of (B−D) and (C−E) cancel substantially cancel each other, but do not eliminate each other completely so as to total slightly negative, i.e., {(C−E)+(B−D)}<0. Similarly, the values of (G−E) and (H−F) substantially cancel each other, but do not eliminate each other completely so as to total slightly negative, i.e., {(H−F)+(G−E)}<0. Accordingly, the frequency of the playback clock generated by the voltage controlled oscillator 14 becomes small momentarily and the playback clock is shifted so as to lag in phase behind the playback differential wave-form signal. When the phase has finally lagged through not 0° but just a half of a period, i.e., 180°, phase is converged. At this time, wrong playback signals are outputted.

FIG. 5 shows relationship between phase lead of the playback clock and phase error output in the conventional playback clock extracting apparatus of FIG. 1. A point where the phase of the playback clock has an angle of 0° relative to that of the playback differential wave-form signal is a proper phase convergent point. However, when phase of the playback clock has deviated through about a half of a period (±180°) from that of the playback differential wave-form signal as shown in FIG. 4, such a phenomenon happens that the results of the decision are continuously "1" or "−1" for two clock cycles. In the differential wave-form, this phenomenon does not happen as long as sampling is performed at the proper phase.

In other words, in addition to the proper phase convergent point where phase of the playback clock has an angle of 0° (or ±360°) relative to that of the playback differential wave-form signal, the wrong phase convergent point also exists at a point where the phase of the playback clock deviates through a half of a period (±180°) from that of the playback differential wave-form signal. As a result, it becomes impossible to playback signals at high fidelity.

Then, regarding the above problem (4), a reason why momentary phase jitter is produced in the generated playback clock is described below in more detail. Suppose that results of ternary decision on signal string {an} are as follows, the following phase error outputs are obtained.

| (Signal string) | (Ternary decision) | (Phase error output) |
| --- | --- | --- |
| a1 | 0 | |
| a2 | 0 | 0 |
| a3 | 1 | 0 |
| a4 | 0 | a2−a4 |
| a5 | 0 | 0 |
| a6 | −1 | 0 |
| a7 | 1 | a7−a5 |
| a8 | −1 | a6−a8 |
| a9 | 1 | a9−a7 |
| a10 | 0 | a8−a10 |

Here, when the results of ternary decision are other than "0" continuously, values of (a7−a5) and (a8−a10) become extremely large even if the relay clock is in phase with the playback differential wave-form signal. As a result, since a momentary large offset is produced in the phase error output, momentary phase jitter is produced in the playback clock.

SUMMARY OF THE INVENTION

Accordingly, a first object of the present invention is to provide, with a view to eliminating the above mentioned disadvantages (1) to (4) of the prior art, a playback clock extracting apparatus in which it is possible to fetch phase information also at continuously changing portions of a playback differential wave-from signal and a playback clock having less phase jitter can be generated even when a phase error is calculated in a state where wave-form equalization is not performed or wave-form equalization is performed incompletely.

A second object of the present invention is to provide a playback clock extracting apparatus in which a wrong phase convergent point is prevented from being generated in addition to a proper clock phase convergent point.

A third object of the present invention is to provide a playback clock extracting apparatus in which a playback clock having less momentary phase jitter can be generated also at the continuously changing portions of the playback differential wave-form signal.

In order to accomplish the first object of the present invention, a playback clock extracting apparatus according to the present invention comprises a quantization means for quantizing, at a sampling clock having a rate twice a recording rate, a signal played back from a recording medium so as to output sample data and a digital equalizer for subjecting the sample data to digital equalization so as to alternately output segments of playback data and PLL data at an interval of one sampling clock. The playback clock extacting apparatus also comprises a ternary decision means for making a ternary decision as to whether each segment of playback data is positive, zero or negative and; an arithmetic means for calculating a sampling phase error in the quantization means by multiplying a result of the decision of the ternary decision means by a difference between two successive segments of the PLL data outputted immediately prior to and immediately after the playback data for the decision of the ternary decision means, respectively. The playback clock extracting apparatus further comprises a sampling clock generating means which controls a phase and an oscillation frequency on the basis of the sampling phase error outputted by the arithmetic means so as to generate the sampling clock and a playback clock generating means which divides a frequency of the sampling clock by two so as to generate a playback clock for detecting the playback data.

By the above described arrangement of the playback clock extracting apparatus of the present invention, sampling of analog-to-digital conversion is performed at the sampling clock having the rate twice the recording rate and the arithmetic means calculates the sampling phase error of analog-to-digital conversion by using an other portion of the sample data than the playback data, i.e., the PLL data. Therefore, it is possible to fetch phase information also at continuously changing portions of a playback differential wave-form signal and a playback clock having less phase jitter can be generated even when the phase error is calculated in a state where wave-form equalization is not performed or wave-form equalization is performed incompletely. Meanwhile, even if an equalizer is provided in a loop of a PLL circuit, a PLL is converged without being greatly affected by a convergent state of the equalizer and the equalizer is converged to an optimum value in response to convergence of the PLL. As a result, both the PLL and the equalizer are converged to their optimum values, respectively.

Meanwhile, in order to accomplish the second object of the present invention, a playback clock extracting apparatus of the present invention comprises a quantization means for quantizing, at a sampling clock having a rate equal to a recording rate, a signal played back from a recording medium so as to output sample data acting as playback data, a ternary decision means for making a ternary decision as to whether each segment of playback data is positive, zero or negative and a playback data comparing means for comparing magnitudes of amplitudes of two successive segments of the playback data with each other so as to output a result of the comparison. The playback clock extracting apparatus also comprises a decision changing means, wherein when results of the decision made by the ternary decision means are continuously positive or negative, the decision changing means changes, on the basis of the result of the comparison outputted by the playback data comparing means, to zero the result of the decision on one of the two successive segments of the playback data having a smaller one of the amplitudes so as to output the zero. The playback clock extracting apparatus further comprises an arithmetic means for calculating a sampling phase error in the quantization means by multiplying a result of a change of the decision effected by the decision changing means, by a difference between two segments of the playback data outputted immediately prior to and immediately after the segment of playback data for the decision of the ternary decision means, respectively and a sampling clock generating means which controls a phase and an oscillation frequency on the basis of the sampling phase error outputted by the arithmetic means so as to generate the sampling clock such that the sampling clock acts as a playback clock for detecting the playback data.

By the above described arrangement of the playback clock extracting apparatus of the present invention, when results of the decision made by the ternary decision means are continuously positive or negative, the decision changing means changes, on the basis of the result of the comparison outputted by the playback data comparing means, to zero the result of the decision on one of the successive two segments of the playback data having a smaller one of the amplitudes so as to output the zero. Consequently, a wrong phase convergent point is prevented from being generated in addition to a proper clock phase convergent point.

Furthermore, in order to accomplish the third object of the present invention, a playback clock extracting apparatus of the present invention comprises a quantization means for quantizing, at a sampling clock having a rate twice a recording rate, a signal played back from a recording medium so as to output sample data, a digital equalizer for subjecting the sample data to digital equalization so as to alternately output playback data and PLL data at an interval of one sampling clock and a ternary decision means for making a ternary decision as to whether each segment of playback data is positive, zero or negative. The playback extracting apparatus also comprises an arithmetic means for calculating, by employing the PLL data outputted between two successive segments of the playback data effecting a change of results of the decision of the ternary decision means, a sampling phase error in the quantization means on the basis of a polarity and a data array of the change of the results of the decision of the ternary decision means. The playback clock further comprises a sampling clock generating means which controls a phase and an oscillation frequency on the basis of the sampling phase error outputted by the arithmetic means so as to generate the sampling clock and a playback clock generating means which divides a frequency of the sampling clock by two so as to generate a playback clock for detecting the playback data, wherein for a group including one value other than zero and successive values other than zero in the results of the decision of the ternary decision means. The arithmetic means directly subjects to addition or subtraction a first segment of the PLL data outputted between two successive segments of the playback data leading to results of zero and a value other than zero of the decision of the ternary decision means, respectively, having a first offset and a second segment of the PLL data outputted between two successive segments of the playback data leading to results of a value other than zero and zero of the decision of the ternary decision means, respectively, having a second offset, so as to cancel out the first and second offsets of the first and second segments of the PLL data and output a result of the addition or the subtraction.

In addition, the arithmetic means preferably includes a polarity changeover means for performing change-over of a polarity of the PLL data in accordance with a direction of a change of two successive ones of the results of the decision of the ternary decision means, a storage means and an addition means; wherein when the two successive ones of the results of the decision of the ternary decision means change from zero to a value other than zero, an output of the polarity changeover means is stored in the storage means; wherein when the two successive ones of the results of the decision of the ternary decision means change from a value other than zero to a value other than zero, an output of the polarity changeover means is used as the phase error outputted by the arithmetic means; wherein when the two successive ones of the results of the decision of the ternary decision means change from a value other than zero to zero, the output of the polarity changeover means and a value stored in the storage means are subjected to arithmetical mean by the addition means so as to be outputted as the phase error.

By the above described arrangement of the playback clock extracting apparatus of the present invention, sampling of analog-to-digital conversion is performed at the sampling clock having the rate twice the recording rate and the arithmetic means calculates the phase error by employing the PLL data outputted between two successive ones of the playback data effecting a change of results of the decision of the ternary decision means. Therefore, in case the differentiated wave of the playback data is isolated, a difference between successive ones of the PLL data appearing before and after the playback data is taken so as to cancel the offsets. Meanwhile, in case the playback data changes continuously according to recording rate, offsets generated at foremost and rearmost ends of the playback data are directly subjected to addition or subtraction so as to be cancelled. Consequently, since all phase information provided by points of change in the playback signal can be utilized and the phase error output free from momentary offset can be obtained, it is possible to generate the playback clock having less momentary phase jitter.

BRIEF DESCRIPTION OF THE DRAWINGS

These objects and features of the present invention will become apparent from the following description taken in conjunction with the preferred embodiments thereof with reference to the accompanying drawings, in which:

FIGS. 13A, 13B and 13C are views explanatory of operation of the playback clock extracting apparatus of FIG. 11.

Before the description of the present invention proceeds, it is to be noted that like parts are designated by like reference numerals throughout several views of the accompanying drawings.

DETAILED DESCRIPTION OF THE INVENTION

Figure 1:
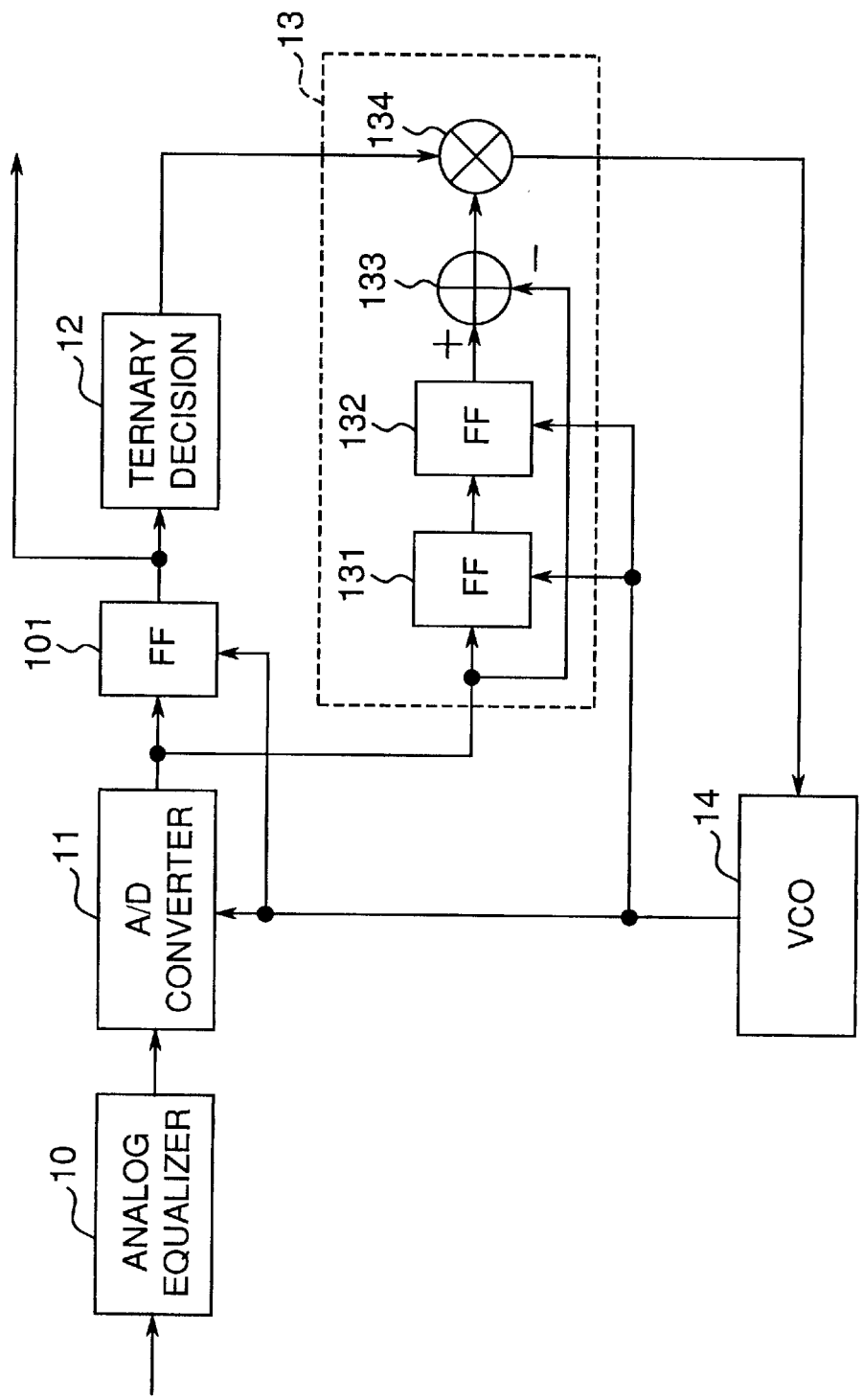
FIG. 1 is a block diagram showing a configuration of a prior art playback clock extracting apparatus.
Figure 2:
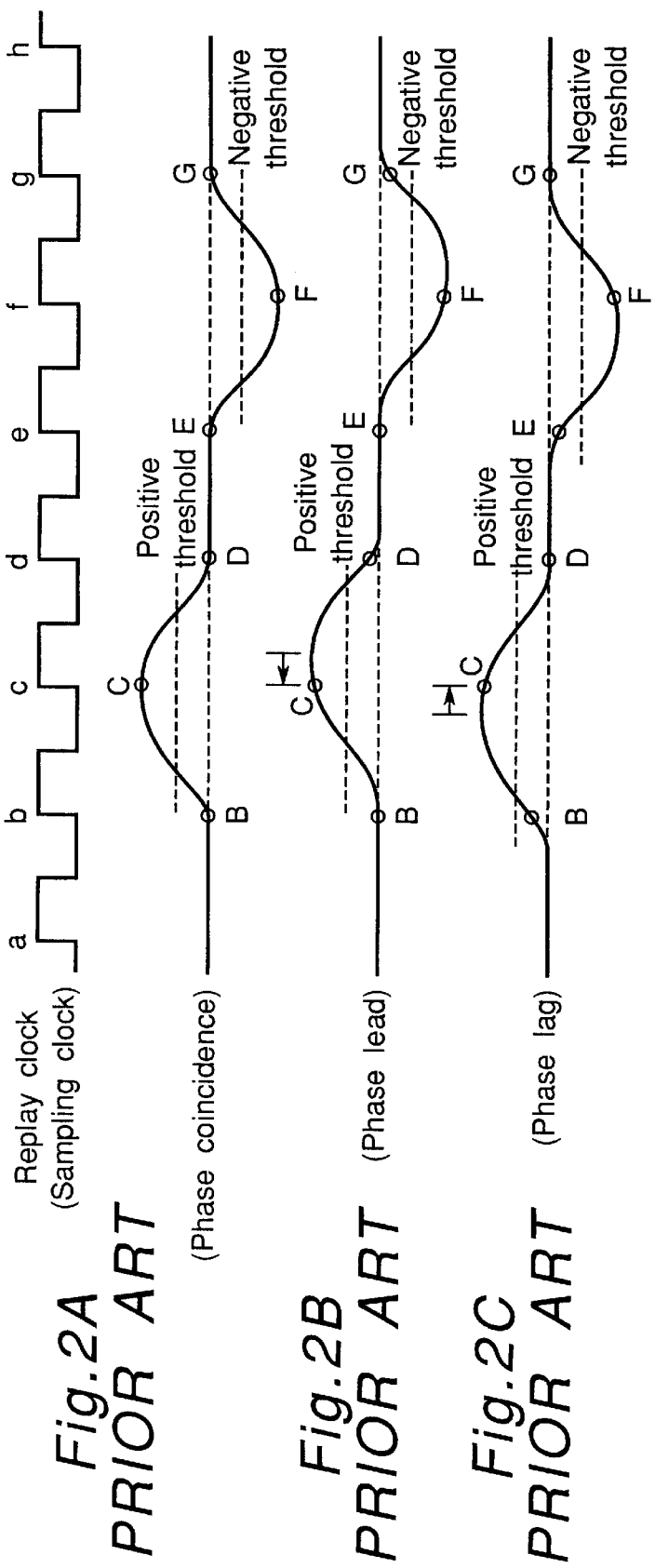
FIGS. 2A, 2B and 2C are timing charts showing the relationship between playback differential wave-form signal and playback clock (sampling clock) in the prior art playback clock extracting apparatus of FIG. 1.
Figure 3:
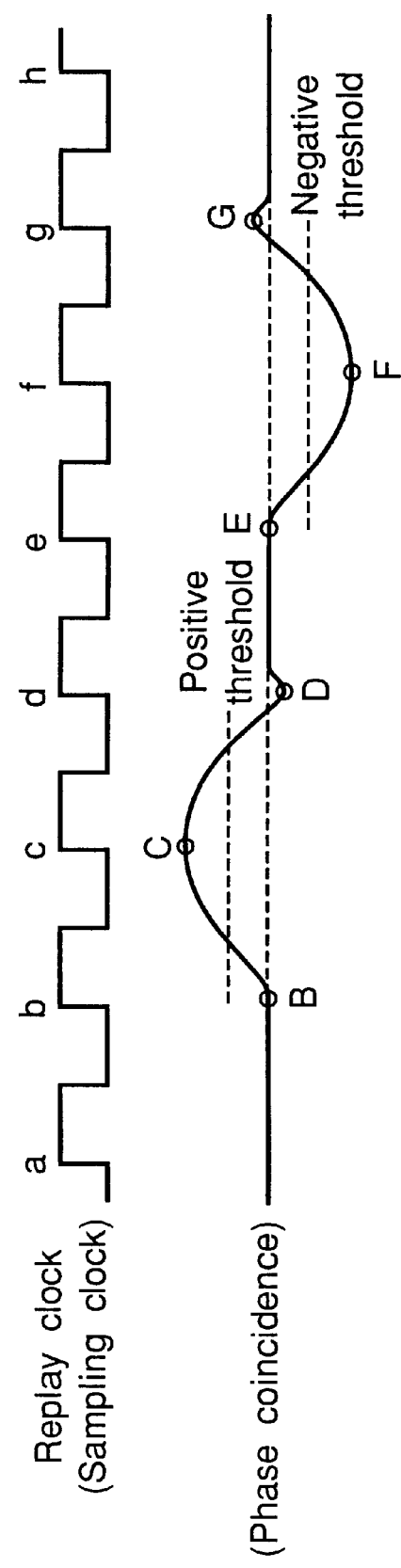
FIG. 3 is a timing chart showing the relationship between playback differential wave-form signal subjected to incomplete wave-form equalization and playback clock (sampling clock) in the prior art playback clock extracting apparatus of FIG. 1.
Figure 4:
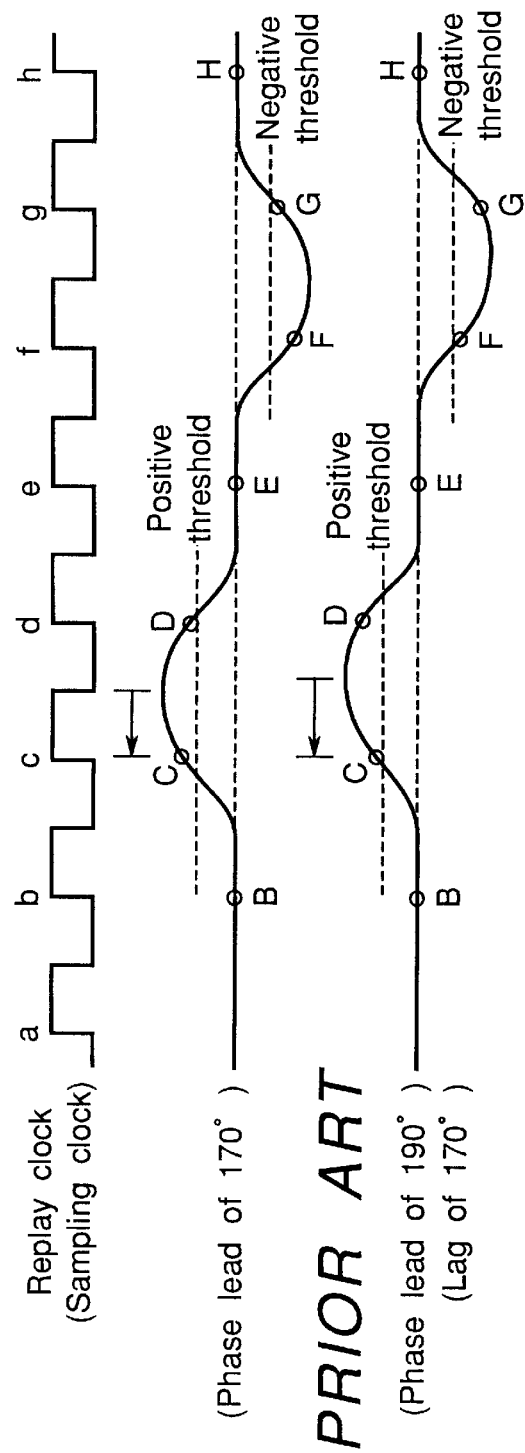
FIGS. 4A and 4B are timing charts showing the relationship between playback differential wave-form signal and playback clock (sampling clock) in the prior art playback clock extracting apparatus of FIG. 1.
Figure 6:
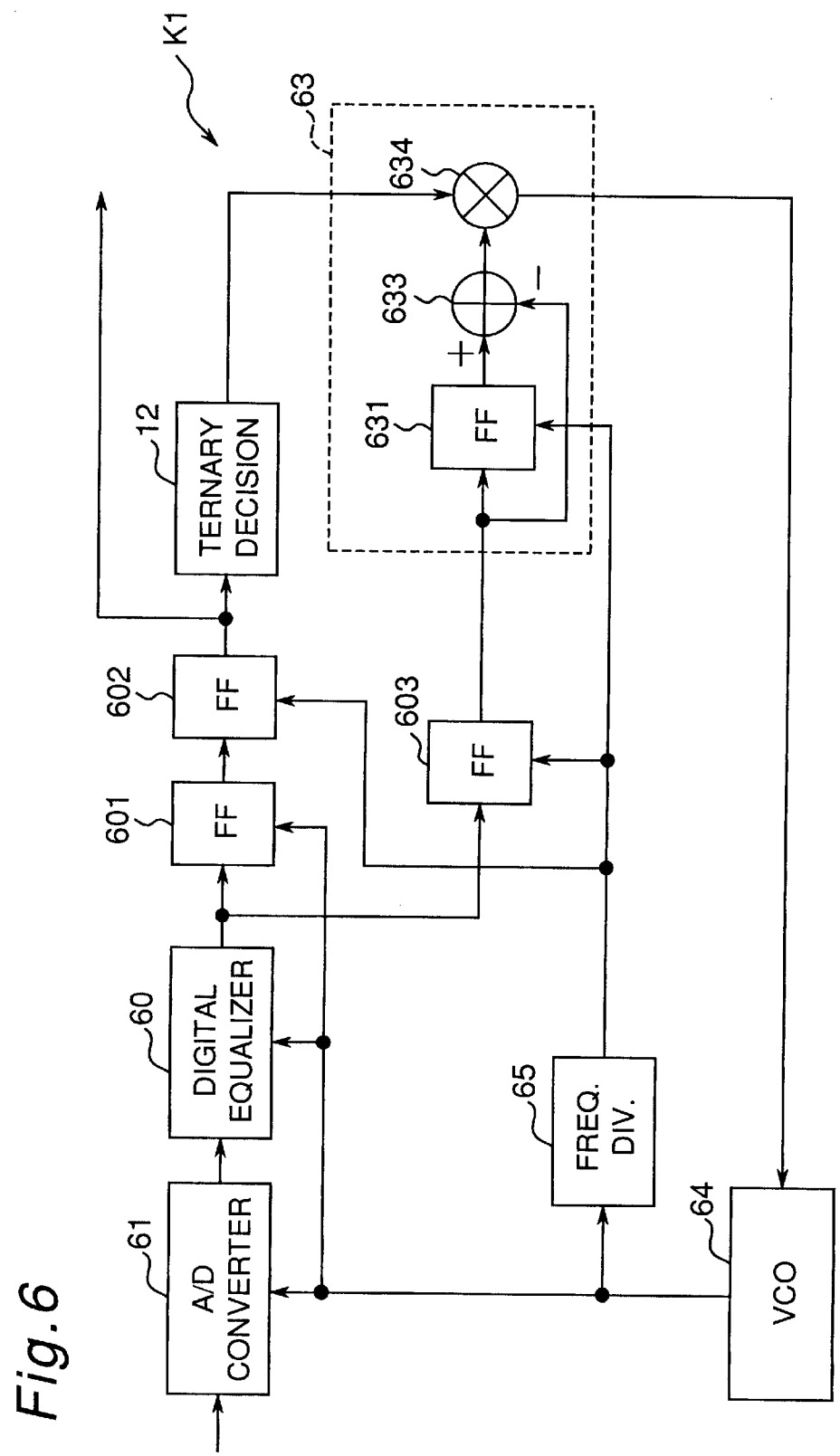
FIG. 6 is a block diagram showing a configuration of a playback clock extracting apparatus according to a first embodiment of the present invention.

Hereinafter, embodiments of the present invention are described with reference to the drawings. FIG. 6 shows a configuration of a playback clock extracting apparatus K1 according to a first embodiment of the present invention. In FIG. 6, an analog-to-digital converter 61 samples an inputted playback differential wave-form signal at a sampling clock having a rate twice a recording rate and outputs the sampled relay differential wave-form signal as digital data. This digital data is inputted to a digital equalizer 60 so as to be subjected to differential equalization such that playback data and PLL data are alternately outputted from the digital equalizer 60 at an interval of one sampling clock cycle. This output data is sequentially inputted to flip-flops 601 and 602 for making a timing adjustment so as to be latched and is outputted as the playback data from the flip-flop 602. The output data from the digital equalizer 60 is also inputted to a flip-flop 603 for making a timing adjustment so as to be latched and is outputted as the PLL data from the flip-flop 603. In contrast with an analog equalizer 10 of a conventional playback clock extracting apparatus of FIG. 1, the digital equalizer 60 is disposed downstream of the analog-to-digital converter 61 in the playback clock extracting apparatus K1.

Figure 7:
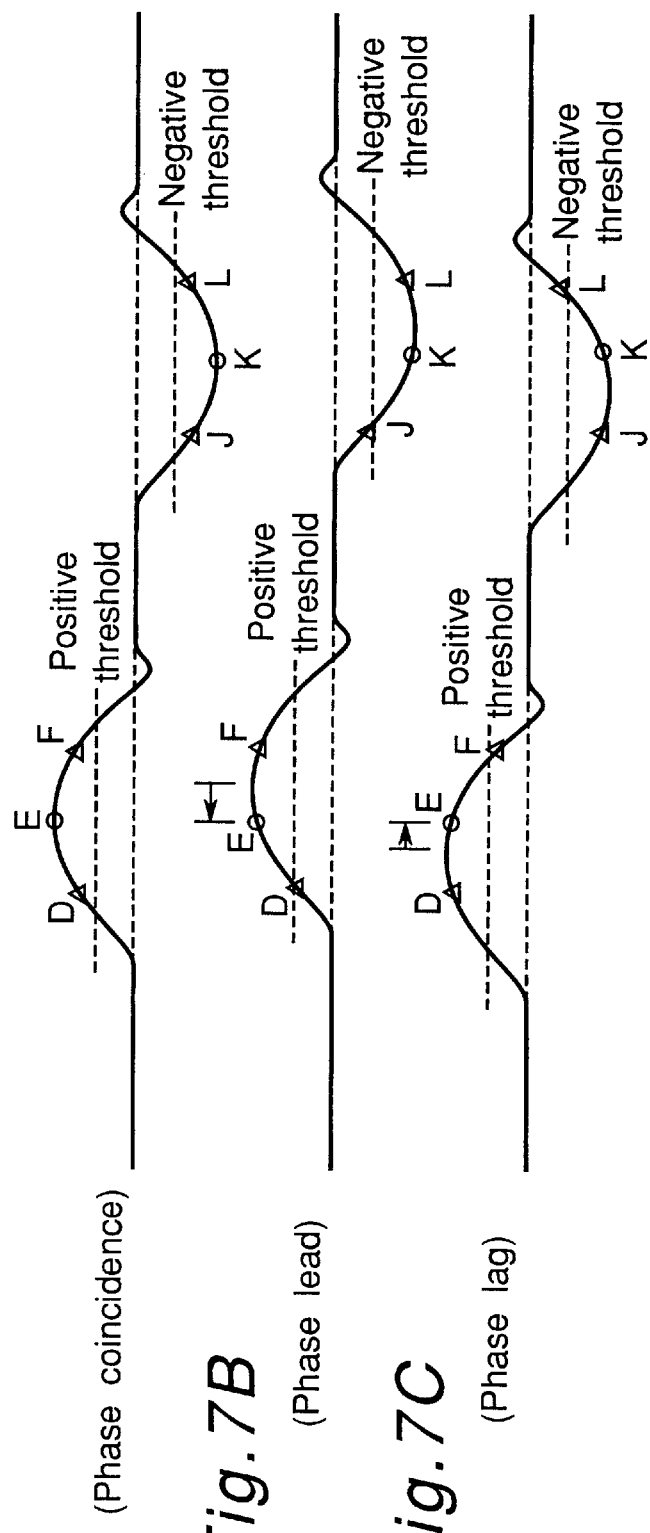
FIGS. 7A, 7B and 7C are timing charts showing the relationship among playback differential wave-form signal subjected to incomplete wave-form equalization, sampling clock and playback clock in the playback clock extracting apparatus of FIG. 6.

A ternary decision circuit 12 makes a ternary decision on the inputted playback data so as to output a result of the decision. Namely, if the inputted playback data is larger than a positive threshold level in FIG. 7, a decision of "1" is made. If the inputted playback data is smaller than a negative threshold value in FIG. 7, a decision of "−1" is made. Otherwise, a decision of "0" is made.

A voltage controlled oscillator 64 adjusts frequency on the basis of an inputted phase error output and outputs a generated sampling clock. Namely, if the inputted phase error output is a positive value and a negative value, frequency of the generated sampling clock becomes momentarily large and small, respectively. This sampling clock is delivered to the analog-to-digital converter 61, the digital equalizer 60, the flip-flop 601 and a frequency divider 65. The frequency divider 65 divides the frequency of the sampling clock by two so as to generate a playback clock and outputs the playback clock. This playback clock is delivered to the flip-flops 602, 603 and 631.

An arithmetic circuit 63 for calculating a phase error is constituted by the flip-flop 631, a subtracter 633 and a multiplier 634. The inputted PLL data is subjected to a delay of one clock cycle by the flip-flop 631 and then, PLL data subsequent by one clock cycle is subtracted from the PLL data outputted by the flip-flop 631 by the subtracter 633. Subsequently, a value obtained by multiplying in the multiplier 634 a result of this subtraction by a result of the decision made by the ternary decision circuit 12 is outputted as a phase error output indicative of the error of sampling phase.

Meanwhile, a delay of three clock cycles of the sampling clock is made from an output of the digital equalizer 60 to an output of the ternary decision circuit 12 by the two flip-flops 601 and 602 and a delay of four clock cycles of the sampling clock is made from the output of the digital equalizer 60 to an output of the flip-flop 631 by the two flip-flops 603 and 631. Therefore, a result of a decision on data which precedes, by one clock cycle of the sampling clock, data inputted to a (−) terminal of the subtracter 633 and follows, by one clock cycle of the sampling clock, data inputted to a (+) terminal of the subtracter 633 is delivered from the ternary decision circuit 12 to the multiplier 634. A loop including the analog-to-digital converter 61, the digital equalizer 60, the flip-flop 603, the arithmetic circuit 63 and the voltage controlled oscillator 64 constitute a phase locked loop (PLL) circuit.

FIGS. 7A–C are timing charts showing the relationship among the playback differential wave-form signal subjected to incomplete differential equalization, the sampling clock and the playback clock in the playback clock extracting apparatus K1. In FIGS. 7A–C, the digital data obtained through sampling at sampling points a to o of the sampling clock in the analog-to-digital converter 61 has values A to O, respectively. In the playback clock extracting apparatus K1, the playback differential wave-form signal is sampled at each rise of the sampling clock by the analog-to-digital converter 61 so as to be subjected to differential equalization by the digital equalizer 60 and then, is latched by the flip-flop 601, while the flip-flop 602 latches an output of the preceding flip-flop 601 at an interval of the playback clock outputted from the frequency divider 65. Therefore, the playback data assumes the values A, C, E, G, I, K, M and O, while the values B, D, F, H, J, L and N do not become the playback data but become the PLL data.

FIG. 7A illustrates a case in which the playback clock is in phase with the playback differential wave-form signal. In this case, a result of a decision made by the ternary decision circuit 12 is other than "0" when the result of the decision is "1" for the value E and is "−1" for the value K. At this time, the phase error output from the arithmetic unit 63 assumes values of (D−F) and (L−J).

Even if the playback differential wave-form signal has been subjected to incomplete differential equalization at this time, distortion in the playback differential wave-form signal is small except in the vicinity of zero-crossings and the values of (D−F) and (L−J) are substantially zero in phase of FIG. 7A. Hence, the frequency of the sampling clock generated by the voltage controlled oscillator 64 is held and the playback clock is held in phase with the playback differential wave-form signal.

FIG. 7B illustrates a case in which the playback clock leads in phase the playback differential wave-form signal. Also in this case, a result of a decision made by the ternary decision circuit 12 is other than "0" when the result of the decision is "1" for the value E and is "−1" for the value K. At this time, the phase error output from the arithmetic unit 63 assumes values of (D−F) and (L−J).

In phase of FIG. 7B, since both of the values of (D−F) and (L−J) are negative, the frequency of the sampling clock generated by the voltage controlled oscillator 64 becomes small momentarily, so that the playback clock shifts in such a direction as to lag in phase relative to the playback differential wave-form signal, i.e., in such a direction as to be in phase with the playback differential wave-form signal.

FIG. 7C illustrates a case in which the playback clock lags in phase behind the playback differential wave-form signal. Also in this case, a result of a decision made by the ternary decision circuit 12 is other than "0" when the result of the decision is "1" for the value E and is "−1" for the value K. At this time, the phase error output from the arithmetic unit 63 assumes values of (D−F) and (L−J).

In phase of FIG. 7C, since both of the values of (D−F) and (L−J) are positive, the frequency of the sampling clock generated by the voltage controlled oscillator 64 becomes large momentarily, so that the playback clock shifts in such a direction as to lead in phase the playback differential wave-form signal, i.e., in such a direction as to be in phase with the playback differential wave-form signal.

Meanwhile, suppose that results of the ternary decision on signal string {bn} are as follows, the following phase error outputs are obtained.

| (Signal string) | (Ternary decision) | (Phase error output) |
|---|---|---|
| b1 | 0 | |
| b2 | | 0 |
| b3 | 0 | |
| b4 | | 0 |
| b5 | 1 | |
| b6 | | b4−b6 |
| b7 | 0 | |
| b8 | | 0 |
| b9 | 0 | |
| b10 | | 0 |
| b11 | −1 | |
| b12 | | b12−b10 |
| b13 | 1 | |
| b14 | | b12−b14 |
| b15 | −1 | |
| b16 | | b16−b14 |
| b17 | 1 | |
| b18 | | b16−b18 |
| b19 | 0 | |
| b20 | | 0 |

Therefore, even when the results of the ternary decision are other than "0" continuously, phase information is not cancelled.

In the first embodiment, sampling of analog-to-digital conversion is performed at the sampling clock having the rate twice the recording rate and the arithmetic circuit 63 calculates the sampling phase error by using the less distorted sample data (PLL data) rather than from the playback data as described above. Therefore, even if the phase error is calculated in a state where wave-form equalization is not performed or is performed incompletely, the playback clock having less phase jitter can be generated. In addition, even at portions of the playback differential wave-form signal, where the playback differential wave-form signal is changing continuously, it is possible to fetch phase information.

Meanwhile, in the first embodiment, phase information is fetched from the sample data (PLL data) rather than from the playback data. Therefore, even if the digital equalizer 60 is provided in the loop of the PLL circuit, the PLL is converged without being greatly affected by the convergent state of the equalizer and the equalizer is converged to an optimum value in response to the convergence of the PLL. As a result, both the PLL and the equalizer can be converged to their optimum values.

Figure 8:
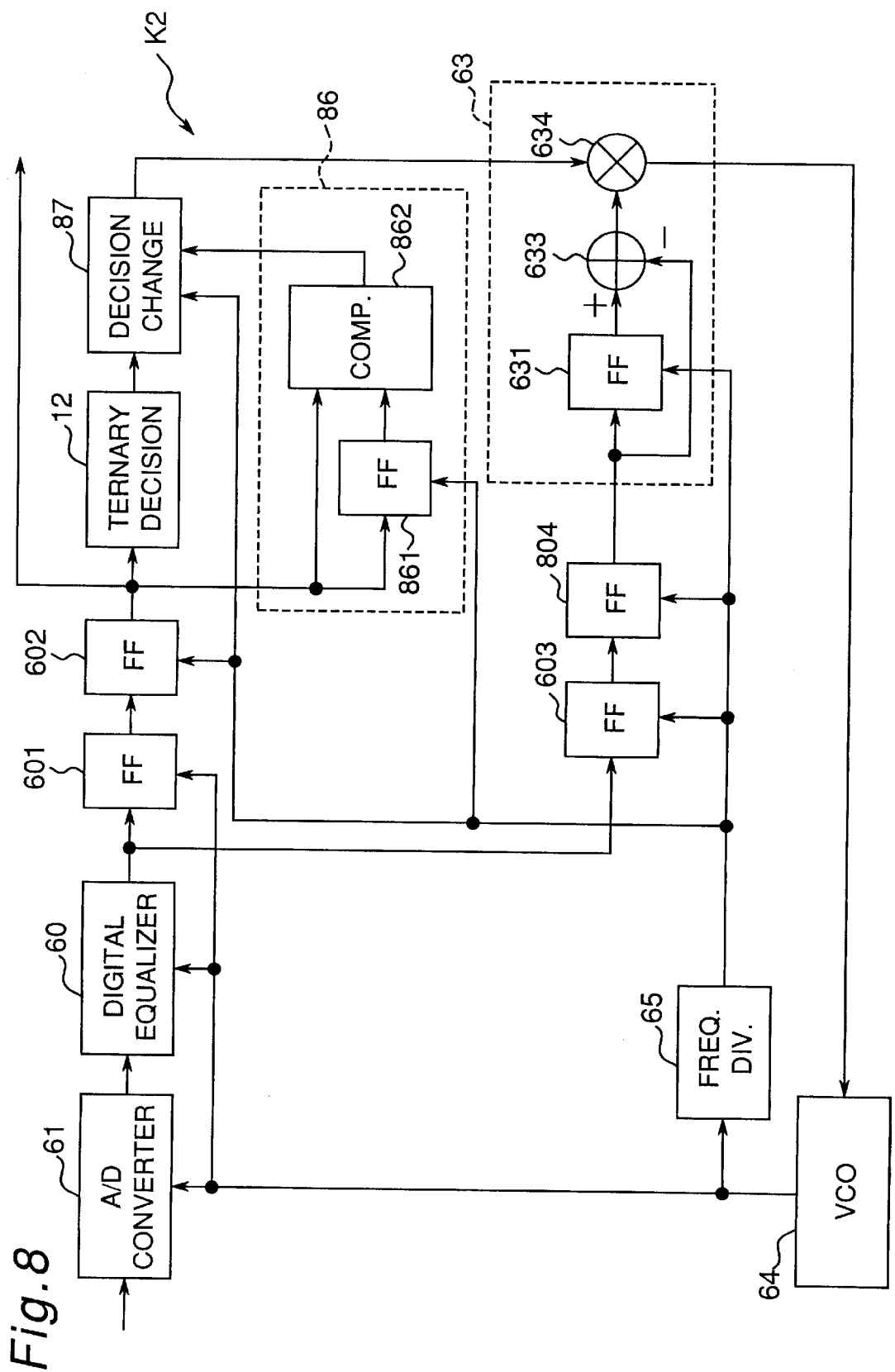
FIG. 8 is a block diagram showing a configuration of a playback clock extracting apparatus according to a second embodiment of the present invention.

FIG. 8 shows a configuration of a playback clock extracting apparatus K2 according to a second embodiment of the present invention. The playback clock extracting apparatus K2 includes the digital equalizer 60, the analog-to-digital converter 61, the ternary decision circuit 12, the arithmetic circuit 63, the voltage controlled oscillator 64 and the frequency divider 65 in the same manner as the playback clock extracting apparatus K1. In the playback clock extracting apparatus K2, a playback data comparing circuit 86, a decision changing circuit 87 and a flip-flop 804 are added to the playback clock extracting apparatus K1. Since other constructions of the playback clock extracting apparatus K2 are similar to those of the playback clock extracting apparatus K1, the description is abbreviated for the sake of brevity.

The playback data comparing circuit 86 is constituted by a flip-flop 861 and a comparator 862 and compares magnitude of amplitude of the playback data with that of the playback data preceding by one clock cycle of the playback clock the playback data so as to output a result of the comparison.

When results of the decision made by the ternary decision circuit 12 are continuously positive or negative, the decision changing circuit 87 forcedly changes, on the basis of a result of the comparison outputted by the playback data comparing circuit 86, to "0" the result of the decision on one of the first and second playback data having a smaller amplitude and outputs "0".

The playback clock is delivered to the flip-flops 602, 603 and 631 and is further delivered to the decision changing circuit 87, the flip-flop 804 and the flip-flop 861 of the playback data comparing circuit 86.

Meanwhile, a delay of a total of five clock cycles of the sampling clock including three clock cycles of the sampling clock due to the two flip-flops 601 and 602 and a delay of two clock cycles of the sampling clock required for processing in the decision changing circuit 87 is made from an output of the digital equalizer 60 to an output of the decision changing circuit 87 and a delay of six clock cycles of the sampling clock is made from the output of the digital equalizer 60 to an output of the flip-flop 631 by the three flip-flops 603, 804 and 631. Therefore, a result of a decision made on data which precedes, by one clock cycle of the sampling clock, data inputted to a (−) terminal of the subtracter 633 and follows, by one clock cycle of the sampling clock, data inputted to a (+) terminal of the subtracter 633 is delivered from the decision changing circuit 87 to the multiplier 634. A loop including the analog-to-digital converter 61, the digital equalizer 60, the flip-flops 603 and 804, the arithmetic circuit 63 and the voltage controlled oscillator 64 constitute a phase locked loop (PLL) circuit.

Figure 9:
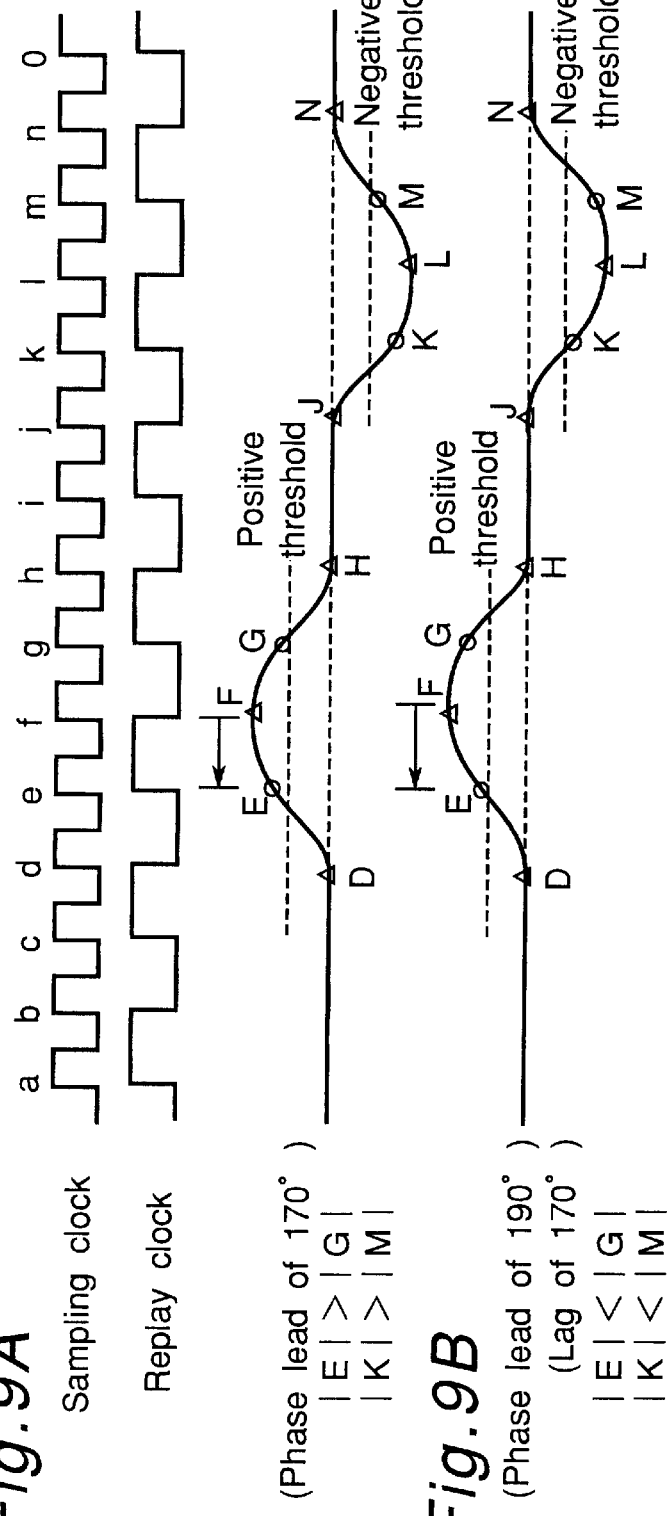
FIGS. 9A and 9B are timing charts showing the relationship among playback differential wave-form signal, sampling clock and playback clock in the playback clock extracting apparatus of FIG. 8.

FIGS. 9A and B are a timing charts showing the relationship among the playback differential wave-form signal, the sampling clock and the playback clock in the playback clock extracting apparatus K2. In FIGS. 9A and B, the digital data obtained through sampling at sampling points a to o of the sampling clock in the analog-to-digital converter 61 has values A to O, respectively.

In the playback clock extracting apparatus K2, the playback differential wave-form signal is sampled at each rise of the sampling clock by the analog-to-digital converter 61 so as to be subjected to differential equalization by the digital equalizer 60 and then, is latched by the flip-flop 601, while the flip-flop 602 latches an output of the preceding flip-flop 601 at an interval of the playback clock outputted from the frequency divider 65. Therefore, the playback data assumes the values A, C, E, G, I, K, M and O, while the values B, D, F, H, J, L and N do not become the playback data but become the PLL data.

FIG. 9A illustrates a case in which the playback clock leads through about 170° in phase the playback differential wave-form signal. In this case, a result of a decision made by the ternary decision circuit 12 is other than "0" when the result of the decision is "1" for the values E and G and is "−1" for the values K and M. Here, since the values E and G are continuously "1", the playback data comparing circuit 86 outputs a result of comparison of (|E|>|G|) to the decision changing circuit 87, so that the result of the decision on the playback data having the smaller amplitude G is forcedly changed to "0" by the decision changing circuit 87. Meanwhile, since the values K and M are continuously "−1", the playback data comparing circuit 86 outputs a result of comparison of (|K|>|M|) to the decision changing circuit 87, so that the result of the decision on the playback data having the smaller amplitude M is forcedly changed to "0" by the decision changing circuit 87.

Therefore, since the phase error output from the arithmetic circuit 63 assumes values of (D−F) and (L−J) both of which are negative, the frequency of the sampling clock generated by the voltage controlled oscillator 64 becomes small momentarily, so that the playback clock shifts in such a direction as to lag in phase relative to the playback differential wave-form signal, i.e., in such a direction as to be in phase with the playback differential wave-form signal.

FIG. 9B illustrates a case in which playback clock leads through about 190° in phase the playback differential wave-form signal, namely, lags through about 170° in phase behind the playback differential wave-form signal. Also in this case, a result of a decision made by the ternary decision circuit 12 is other than "0" when the result of the decision is "1" for the values E and G and is "−1" for the values K and M. Here, since the values E and G are continuously "1", the playback data comparing circuit 86 outputs a result of comparison of (|E|<|G|) to the decision changing circuit 87, so that the result of the decision on the playback data having the smaller amplitude E is forcedly changed to "0" by the decision changing circuit 87. Meanwhile, since the values K and M are continuously "−1", the playback data comparing circuit 86 outputs a result of comparison of (|K|<|M|) to the decision changing circuit 87, so that the result of the decision on the playback data having the smaller amplitude K is forcedly changed to "0" by the decision changing circuit 87.

Therefore, since the phase error output from the arithmetic circuit 63 assumes values of (F−H) and (N−L) both of which are positive, the frequency of the sampling clock generated by the voltage controlled oscillator 64 becomes large momentarily, so that the playback clock shifts in such a direction as to lead in phase the playback differential wave-form signal, i.e., in such a direction as to be in phase with the playback differential wave-form signal.

Figure 5:
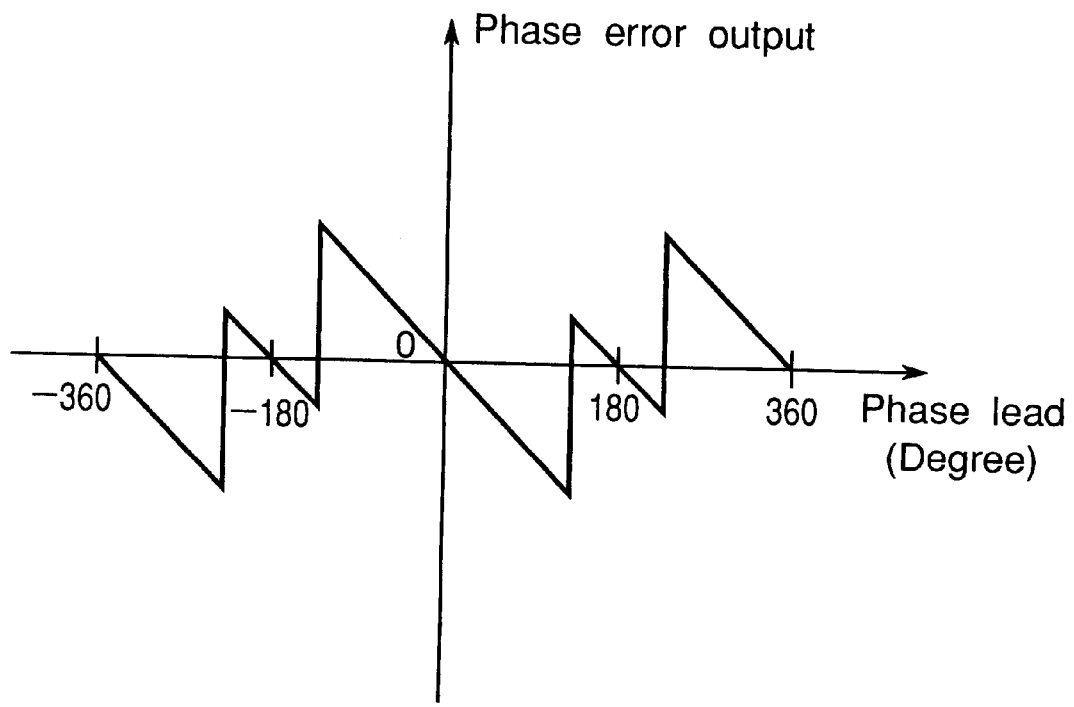
FIG. 5 is a graph showing the relationship between phase lead of playback clock and phase error output in the prior art playback clock extracting apparatus of FIG. 1.
Figure 10:
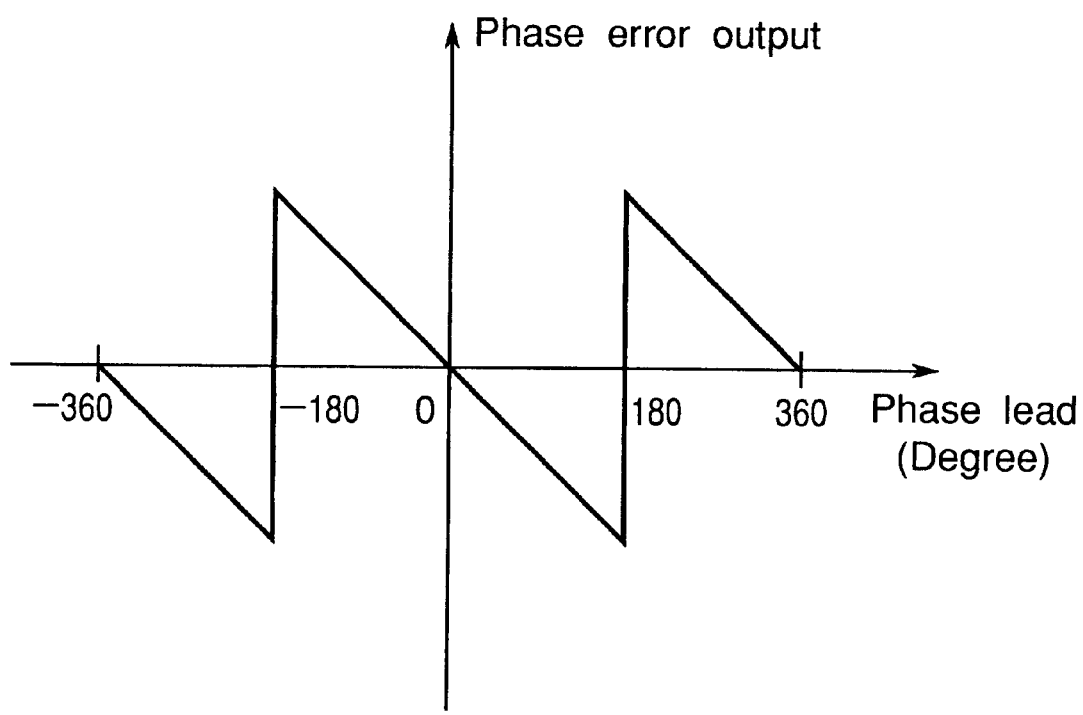
FIG. 10 is a graph showing relation between phase lead of playback clock and phase error output in the playback clock extracting apparatus of FIG. 8.

FIG. 10 shows the relationship between phase lead of the playback clock and phase error output in the playback clock extracting apparatus K2. In the conventional playback clock extracting apparatus of FIG. 1 and the playback clock extracting apparatus K1, the wrong phase convergent point is generated when the phase of the playback clock deviates through about a half of a period (±180°) from that of the playback differential wave-form signal as shown in FIG. 5. However, in the second embodiment, even if phase of the playback clock deviates through about the half of the period (±180°) from that of the playback differential wave-form signal and thus, the two results of the decision are continuously "1" or "−1" for two clock cycles in the ternary decision circuit 12, one of the two results of the decision is forcedly changed to "0" by the decision changing circuit 87, so that such a phenomenon does not occur such that the phase of the playback clock is converged erroneously when the phase of the playback clock deviates through the half of the period (±180°) from that of the playback differential wave-form signal. Accordingly, the phase of the playback clock is converged when the phase of the playback clock properly has an angle of 0° relative to that of the playback differential wave-form signal.

In the playback clock extracting apparatus K2, the circuit configuration is slightly more complicated than that of the playback clock extracting apparatus K1. However, when the results of the decision made by the ternary decision circuit 12 are continuously positive or negative, the decision changing circuit 87 forcedly changes, on the basis of the result of comparison outputted by the playback data comparing circuit 86, to "0" one of the results of the decision on the playback data having the smaller amplitude and outputs "0". Therefore, in the playback clock extracting apparatus K2, since phase error output has such characteristics as shown in FIG. 10 relative to phase lead of the playback clock in addition to the effects of the playback clock extracting apparatus K1, the phenomenon is eliminated such that the wrong phase convergent point is generated in addition to the proper phase convergent point.

Meanwhile, from a standpoint that generation of the wrong phase convergent point in addition to the proper phase convergent point is prevented by neglecting influence of phase jitter, sampling of analog-to-digital conversion may be performed not at the sampling clock having the rate twice the recording rate, but at a sampling clock having a rate equal to the recording rate in the playback clock extracting apparatus K2.

Figure 11:
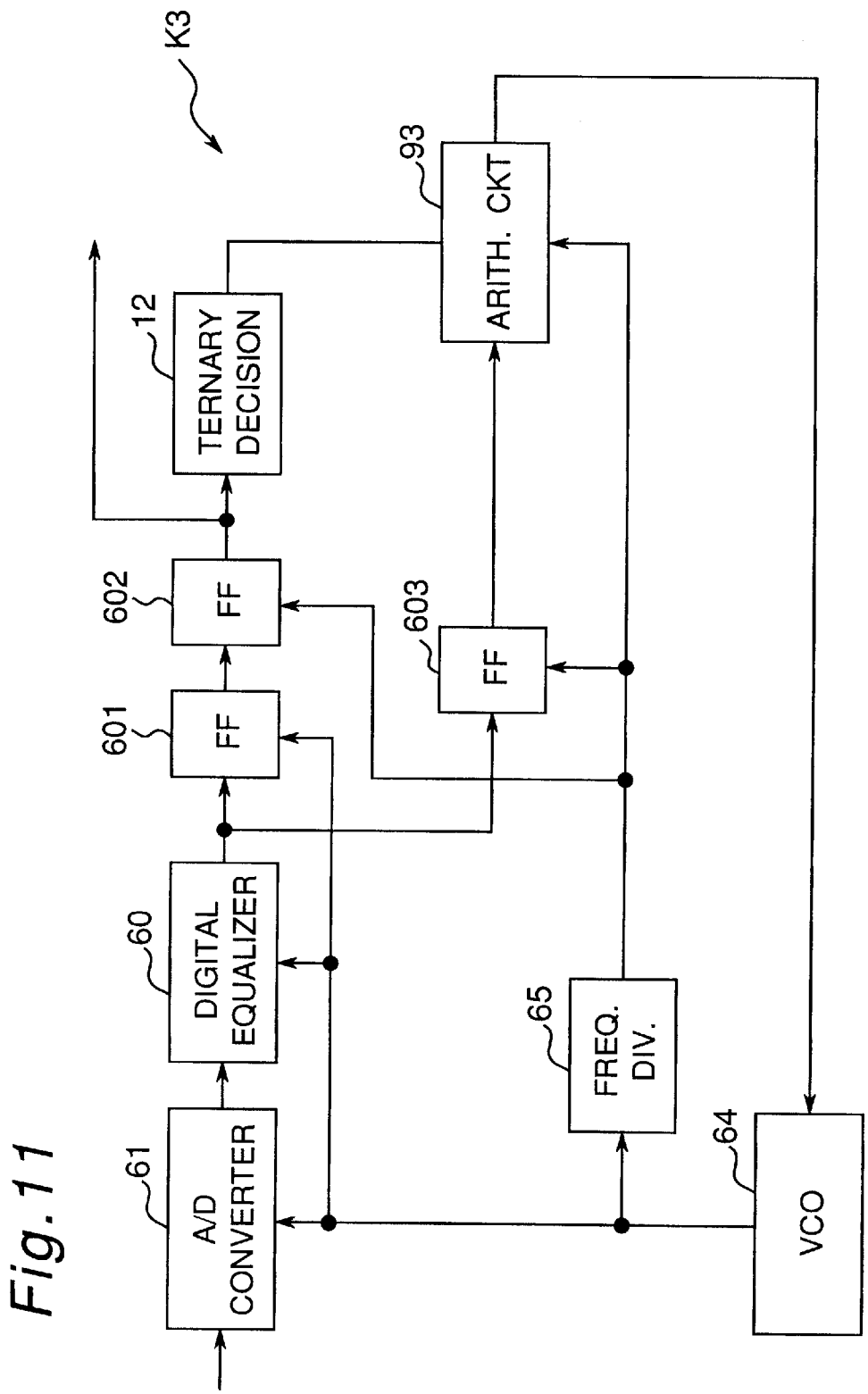
FIG. 11 is a block diagram showing a configuration of a playback clock extracting apparatus according to a third embodiment of the present invention.

FIG. 11 shows a configuration of a playback clock extracting apparatus K3 according to a third embodiment of the present invention. The playback clock extracting apparatus K3 includes the digital equalizer 60, the analog-to-digital converter 61, the ternary decision circuit 12, the voltage controlled oscillator 64 and the frequency divider 65 in the same manner as the playback clock extracting apparatus K1. In the playback clock extracting apparatus K3, the arithmetic circuit 63 of the playback clock extracting apparatus K1 is replaced by an arithmetic circuit 93 for calculating a phase error. Since other constructions of the playback clock extracting apparatus K3 are similar to those of the playback clock extracting apparatus K1, the description is abbreviated for the sake of brevity.

The arithmetic circuit 93 performs a direct addition or subtraction on PLL data outputted between two successive segments of the playback data leading to results of "0" and a value other than "0" of the decision made by the ternary decision circuit 12, respectively and PLL data outputted between two successive segments of the playback data leading to results of a value other than "0" and "0" of the decision made by the ternary decision circuit 12, respectively, and outputs the phase error by cancelling offsets of the respective PLL data.

Figure 12:
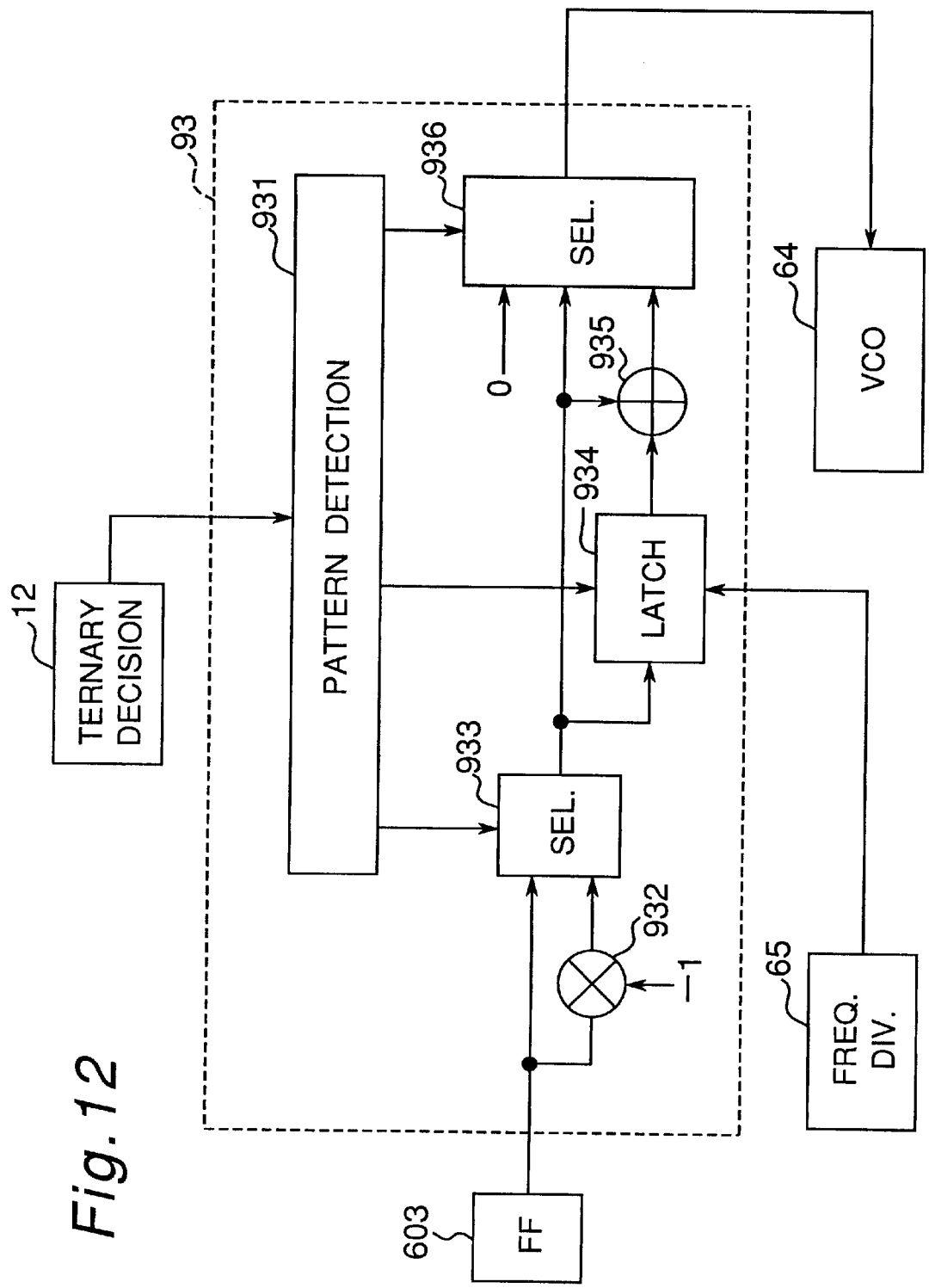
FIG. 12 is a block diagram showing a concrete configuration of an arithmetic circuit employed in the playback clock extracting apparatus of FIG. 11.

FIG. 12 shows a concrete configuration of the arithmetic circuit 93. In FIG. 12, a pattern detecting circuit 931 detects a direction and specific pattern of change of the result of the decision made by the ternary decision circuit 12 and outputs control signals to selectors 933 and 936 and an enable signal to a latch circuit 934. A multiplier 932 multiplies the PLL data by (−1) so as to change sign of the PLL data. When the two continuous results of the decision change to a positive value or a negative value in the pattern detecting circuit 931, a selector 933 selects and outputs the PLL data and the PLL data subjected to sign change, respectively. Meanwhile, when the two continuous results of the decision change from a positive value to "0" in the pattern detecting circuit 931, the selector 933 selects and outputs the PLL data subjected to sign change. When the two continuous results of the decision change from an other value than a positive value to "0" in the pattern detecting circuit 931, the selector 933 selects and outputs the PLL data.

When the two continuous results of the decision change from "0" to an other value than "0" in the pattern detecting circuit 931, the latch circuit 934 latches an output of the selector 933. Otherwise, the latch circuit 934 holds a preceding value.

An adder 935 takes an arithmetical mean of the output of the selector 933 and a value latched in the latch circuit 934.

When the two continuous results of the decision change from "0" to "0" and from "0" to a value other than "0" in the pattern detecting circuit 931, the selector 936 outputs "0" as the phase error output. When the two continuous results of the decision change from a value other than "0" to a value other than "0" in the pattern detecting circuit 931, the selector 936 outputs the output of the selector 933 as the phase error output. Meanwhile, when the two continuous results of the decision change from a value other than "0" to "0" in the pattern detecting circuit 931, the selector 936 outputs an output of the adder 935 as the phase error output.

Here, the arithmetical mean in the adder 935 is (½) of a sum of the inputs but ideally, is (1/√2) of the sum of the inputs. The arithmetical mean of the adder 935 assumes "0" at the convergent point and thus, does not require high accuracy. Therefore, the arithmetical mean of the adder 935 may be replaced by the mere sum of the inputs or a value obtained by multiplying the sum of the inputs by a proper multiplier.

Suppose that the results of ternary decision on signal string {bn} are as follows, the following phase error outputs are obtained.

| (Signal string) | (Ternary decision) | (Phase error output) |
| --- | --- | --- |
| b1 | 0 | |
| b2 | | 0 |
| b3 | 1 | |
| b4 | | (b2−b4)/2 |
| b5 | 0 | |
| b6 | | 0 |
| b7 | 0 | |
| b8 | | 0 |
| b9 | −1 | |
| b10 | | b10 |
| b11 | 1 | |
| b12 | | −b12 |
| b13 | −1 | |
| b14 | | b14 |
| b15 | 1 | |
| b16 | | (−b8−b16)/2 |
| b17 | 0 | |
| b18 | | 0 |
| b19 | 0 | |
| b20 | | 0 |

FIGS. 13A–C show operation of the playback clock extracting apparatus K3 and corresponds to the signal string {bn} referred to above. FIG. 13A shows wave form of the playback signal subjected to differential equalization by the digital equalizer 60, while FIG. 13B shows the output of the selector 933, i.e., the phase error signal having the offset in the prior art. On the other hand, FIG. 13C shows the phase error signal of the relay clock extracting apparatus K3, in which the offset present in the output of the selector 933 is cancelled completely. In FIGS. 13A and B, smudged portions depict components of the phase error signal.

In the playback clock extracting apparatus K3, the circuit configuration is slightly more complicated than that of the playback clock extracting apparatus K1, but the arithmetic circuit 93 calculates the phase error by using the PLL data outputted between two successive segments of the playback data causing change in the outputs of the ternary decision circuit 12. Therefore, in case a differentiated wave of the playback data is isolated, a difference between successive segments of the PLL data appearing before and after the playback data are taken so as to cancel the offsets. Meanwhile, in case the playback data changes continuously according to recording rate, offsets generated at foremost and rearmost ends of the playback data are directly subjected to addition or subtraction so as to be cancelled. Consequently, since all phase information provided by points of change in the playback signal can be utilized and the phase error output free from momentary offset can be obtained, it is possible to generate the playback clock having less momentary phase jitter.

Figure 14:
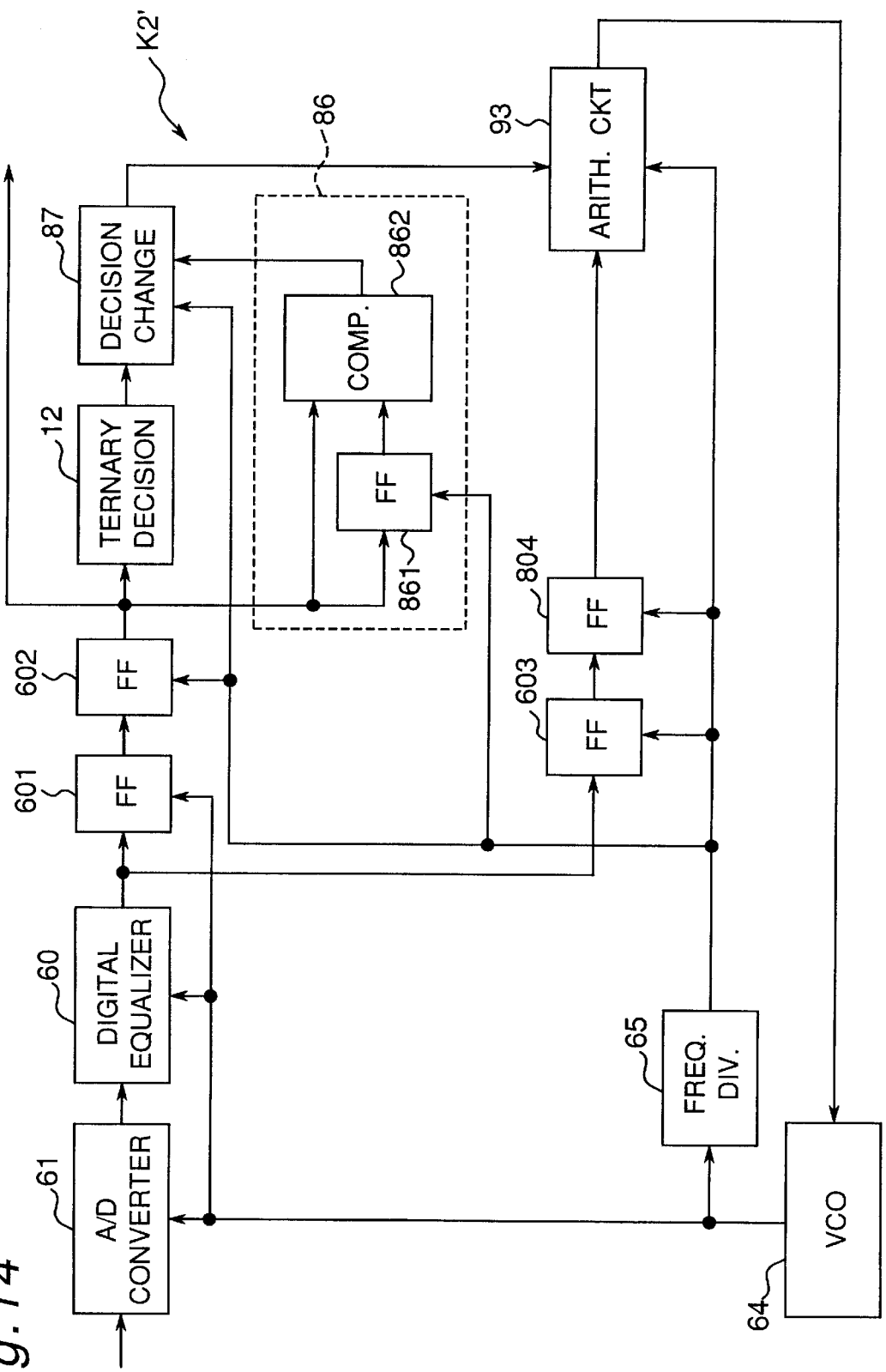
FIG. 14 is a view similar to FIG. 8, particularly showing its modification.

Furthermore, the arithmetic circuit 63 of the playback clock extracting apparatus K2 may be replaced by the arithmetic circuit 93 of the playback clock extracting apparatus K3 as shown in FIG. 14 depicting a playback clock extracting apparatus K2' which is a modification of the playback clock extracting apparatus K2.

What is claimed is:

1. A playback clock extracting apparatus, comprising:
   a quantization means for quantizing, at a sampling clock rate twice a recording rate, a signal played back from a recording medium so as to output sample data;
   a digital equalizer for digitally equalizing the sample data so as to alternately output segments of playback data and PLL data at an interval of the sampling clock rate;
   a ternary decision means for making a ternary decision as to whether each segment of playback data is positive, zero or negative;
   an arithmetic means for calculating a sampling phase error in said quantization means by multiplying the ternary decision by a difference between two successive segments of PLL data, one segment of PLL data being outputted immediately prior to the segment of playback data having the ternary decision made thereon by said ternary decision means and the other segment of PLL data being outputted immediately subsequent to the segment of playback data having the ternary decision made thereon by said ternary decision means;
   a sampling clock generating means for controlling a phase and oscillation frequency on the basis of the sampling phase error outputted by said arithmetic means so as to generate the sampling clock rate; and
   a playback clock generating means for dividing a frequency of the sampling clock rate by two so as to generate a playback clock rate for detecting the playback data.

2. A playback clock extracting apparatus claimed in claim 1, further comprising:
   a playback data comparing means for comparing magnitudes of amplitudes of two successive segments of playback data so as to output a result of the comparison; and
   a decision changing means, wherein when the ternary decision made by said ternary decision means is continuously positive or negative, said decision changing means changes, on the basis of the result of said playback data comparing means, the ternary decision to zero for one of the two successive segments of playback data, the one having the lower magnitude of amplitude, and outputs the zero to said arithmetic means.

3. A playback clock extracting apparatus, comprising:
   a quantization means for quantizing, at a sampling clock rate equal to a recording rate, a signal played back from a recording medium so as to output sample data acting as playback data;
   a ternary decision means for making a ternary decision as to whether each segment of playback data is positive, zero or negative;
   a playback data comparing means for comparing magnitudes of amplitudes of two successive segments of playback data so as to output a result of the comparison;
   a decision changing means, wherein when the ternary decision made by said ternary decision means is continuously positive or negative, said decision changing means changes, on the basis of the result of said playback data comparing means, the ternary decision to zero for one of the two successive segments of playback data, the one having the lower magnitude of amplitude, and outputs the zero;
   an arithmetic means for calculating a sampling phase error in said quantization means by multiplying the one ternary decision effected by said decision changing means, by a difference between two segments of playback data, one segment of playback data being outputted immediately prior to a segment of playback data having the ternary decision made thereon by said ternary decision means and the other segment of playback data being outputted immediately subsequent to the segment of playback data having the ternary decision made on by said ternary decision means; and
   a sampling clock generating means for controlling a phase and oscillation frequency on the basis of the sampling phase error outputted by said arithmetic means so as to generate the sampling clock rate which acts as a playback clock rate for detecting the playback data.

4. A playback clock extracting apparatus, comprising:
   a quantization means for quantizing, at a sampling clock rate twice a recording rate, a signal played back from a recording medium so as to output sample data;
   a digital equalizer for digitally equalizing the sample data so as to alternately output segments of playback data and PLL data at an interval of the sampling clock rate;
   a ternary decision means for making a ternary decision as to whether each segment of playback data is positive, zero or negative;
   an arithmetic means for calculating, by employing a segment of PLL data between two successive segments of playback data effecting a change of the ternary decision of said ternary decision means, a sampling phase error in said quantization means on the basis of a pattern of change of polarity of successive ternary decisions of said ternary decision means;
   a sampling clock generating means for controlling a phase and oscillation frequency on the basis of the sampling phase error outputted by said arithmetic means so as to generate the sampling clock rate; and
   a playback clock generating means for dividing a frequency of the sampling clock rate by two so as to generate a playback clock rate for detecting the playback data, wherein for a group of ternary decisions including one ternary decision other than zero and successive ternary decisions other than zero, said arithmetic means directly subjects to addition or subtraction, a first segment of PLL data outputted between two successive segments of playback data leading to ternary decisions of zero and a value other than zero, respectively, having a first offset and a second segment of PLL data outputted between two successive segments of playback data leading to ternary decisions of other than zero and zero, respectively, having a second offset, so as to cancel out the first and second offsets of the first and second segments of PLL data and to output a result of the addition or subtraction.

5. A playback clock extracting apparatus claimed in claim 4, further comprising:

a playback data comparing means for comparing magnitudes of amplitudes of two successive segments of playback data so as to output a result of the comparison; and a decision changing means, wherein when the ternary decisions made by said ternary decision means are continuously positive or negative, said decision changing means changes, on the basis of the result of said playback data comparing means, the ternary decision to zero for one of the two successive segments of playback data, the one having the lower magnitude of amplitude, and outputs the zero to said arithmetic means.

6. A playback clock extracting apparatus claimed in claim 5, wherein said arithmetic means comprises:

a polarity changeover means for performing changeover of a polarity of the PLL data in accordance with a direction of a change of two successive ternary decisions of said ternary decision means;

a storage device; and an addition means, wherein when the two successive ternary decisions of said ternary decision means change from zero to a value other than zero, an output of said polarity changeover means is stored in said storage device, and when the two successive ternary decisions of said ternary decision means change from a value other than zero to a value other than zero, an output of said polarity changeover means is used as the phase error outputted by said arithmetic means, and wherein when the two successive ternary decisions of said ternary decision means change from a value other than zero to zero, an output of said polarity changeover means and a value stored in said storage device are utilized to determine an arithmetical mean by said addition means so as to be outputted as the phase error.

7. A playback clock extracting apparatus claimed in claim 4, wherein said arithmetic means comprises:

a polarity changeover means for performing changeover of a polarity of the PLL data in accordance with a direction of a change of two successive ternary decisions of said ternary decision means;

a storage device; and an addition means, wherein when the two successive ternary decisions of said ternary decision means change from zero to a value other than zero, an output of said polarity changeover means is stored in said storage device, and when the two successive ternary decisions of said ternary decision means change from a value other than zero to a value other than zero, an output of said polarity changeover means is used as the phase error outputted by said arithmetic means, and wherein when the two successive ternary decisions of said ternary decision means change from a value other than zero to zero, an output of said polarity changeover means and a value stored in said storage device are utilized to determine an arithmetical mean by said addition means so as to be outputted as the phase error.

* * * * *